United States Patent
Lin et al.

(10) Patent No.: US 6,673,676 B2
(45) Date of Patent: Jan. 6, 2004

(54) METHOD OF FABRICATING A FLASH MEMORY CELL

(75) Inventors: Chi-Hui Lin, Taipei (TW); Chung-Lin Huang, Taichung (TW); Cheng-Chih Huang, Taipei Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/229,529

(22) Filed: Aug. 27, 2002

(65) Prior Publication Data

US 2003/0045055 A1 Mar. 6, 2003

(30) Foreign Application Priority Data

Sep. 6, 2001 (TW) .......................... 90122047 A

(51) Int. Cl.$^7$ ............................. H01L 21/336
(52) U.S. Cl. ............... 438/257; 438/258; 438/259; 257/200; 257/315; 257/316; 365/185.28
(58) Field of Search ............... 438/257, 258, 438/259, 264, 265, 392, 594; 257/200, 314–316; 365/185.28

(56) References Cited

U.S. PATENT DOCUMENTS

2002/0142545 A1 * 10/2002 Lin ........................... 438/257

* cited by examiner

*Primary Examiner*—Dung A Le
(74) *Attorney, Agent, or Firm*—Merchant & Gould P.C.

(57) ABSTRACT

A method of fabricating a flash memory cell. The method includes the steps of providing a semiconductor substrate; forming a first gate insulating layer; forming a first conductive layer on the first gate insulating layer; forming a floating gate insulating layer; forming a source region by implanting impurity ions into the substrate; forming a second insulating layer; forming a floating gate region; forming a third insulating; forming a second conductive layer on the third insulating layer; forming a fourth insulating layer on the second conductive layer; forming a floating gate region; forming a second conductive layer on the third insulating layer; forming first sidewall spacers; forming control gates and a tunneling oxide; forming second sidewall spacers; and forming a drain region on the substrate.

17 Claims, 10 Drawing Sheets

METHOD OF FABRICATING A FLASH MEMORY CELL

BACKGROUND OF THE INVENTION

1. Field of the Invention

The present invention relates to a memory device, and more particularly to the fabrication of a memory cell of a flash memory.

2. Description of the Prior Art

Complementary metal-oxide-semiconductor (CMOS) memory can be divided into two main categories: random access memory (RAM) and read-only memory (ROM). ROM's market share has been continuously growing in the past few years, and further growth in the near future is foreseen, especially for flash memory in which a single cell is electrically programmable and a block, sector or page of cells that are electrically erasable at the same time. Due to the flexibility of flash memory against electrically programmable read-only memory (EPROM), electrically programmable but erasable via ultraviolet exposure, the market share of flash memory is also experiencing rapid growth. Electrically erasable and programmable read-only memory (EEPROM), electrically erasable and programmable per single byte, will be manufactured for specific applications only, since they use more area and are more expensive. In recent years, flash memory has found interesting applications in electrical consumer products such as: digital cameras, digital video cameras, cellular phones, laptop computers, mobile MP3 players, and Personal Digital Assistants (PDA's). Since portability of these electrical consumer products is strongly prioritized by consumers, the products' size must be minimal. As a result, the capacity of the flash memory must be enlarged, and functions have to be maximized while size is reduced. The capacity of flash memory has increased from 4 to 256 MB, and will increase to even 1 GB in the near future. With the increase in packing density for flash memory, floating gates and control gates have to be made as small as possible. In conventional processes, masks are usually used to define the gates in flash memory. FIGS. 1A to 1G show the manufacturing processes of a conventional flash memory device.

As shown in FIG. 1A, a semiconductor substrate 100 is provided. An LOCOS oxidation process is performed to form a field insulating layer (not shown) on the substrate 100. The field insulating layer isolates each active area. A first insulating layer 110 is formed on the substrate 100 within the active area. The first insulating layer 110 can be oxide formed by oxidation and has a thickness of from 50 to 200 angstroms. Then, a first conductive layer 115, which has a thickness of about 100 to 2000 angstroms, is formed on the first insulating layer 110. The first conductive layer 115 is usually doped polycrystalline silicon formed by chemical vapor deposition (CVD) process. Then, a first masking layer 120, with a thickness of about 500 to 2000 angstroms, is formed on the first conductive layer 115 by depositing a silicon nitride layer.

As shown in FIG. 1B, the first masking layer 120 is removed by performing an etching process to define the first opening 125 and to expose the surface of the first conductive layer 115. The remaining first masking layer 120 will be referred to as 120' hereafter. An oxidation is performed on the exposed surface of the first conductive layer 115 and a first insulating layer 130 is formed.

As shown in FIG. 1C, the remaining first masking layer 120' is removed by performing an etching process. Then, using the first insulating layer 130 as a hard mask, a portion of the first conductive layer 115 and the first insulating layer 110 are sequentially removed to expose the surface of the substrate 100 by anisotropic etching. The portions of the first conductive layer 115 and the first insulating layer 110 under the floating gate insulating layer 130 remain. The remaining first conductive layer 115 forms a floating gate 136. The remaining first insulating layer 110 will be expressed as a first gate insulating layer 132.

As shown in FIG. 1D, a second insulating layer 134 is formed on the surface of the substrate 100, the oxide layer 130, the floating gate 136 and the first gate insulating layer 132. The second insulating layer 132, which has a thickness of about 50 to 250 angstroms, is an oxide and is formed by CVD.

As shown in FIG. 1E, a second conductive layer 135 is formed on the second insulating layer 134. The second conductive layer 135 is usually made of the doped polycrystalline silicon formed by CVD.

As shown in FIG. 1F, portions of the second conductive layer 135 and the second insulating layer 134 are removed by photolithography and etching to form a second opening 142 and a third opening 144. The remaining second conductive layer 135 forms the control gate 170. The remaining second insulating layer 134 will be expressed as a second gate insulating layer 136. Next, a source region 146 is formed on the exposed substrate 100 by implanting N-type ions, such as phosphorus or arsenic into the substrate 100, which is exposed in the second opening 142.

As shown in FIG. 1G, an oxide layer (not shown) is formed to cover the surface and the sidewalls of the control gate 170, the second opening 142 and the third opening 144. Etching is performed to remove portions of the oxide layer and form the sidewall spacers 150 on the sidewalls of the second opening 142 and the third opening 144. A drain region 160 is formed on the exposed substrate 100 by implanting N-type ions, such as phosphorus or arsenic into the substrate 100, which is exposed in the third opening 144. The manufacture of a cell of flash memory is thus completed.

As shown in FIG. 1H, applying the above processes, the second opening 142 and the third opening 144 may shift when photolithography is misaligned. Thus, the lengths of the bottom portion (gate length; L1 and L2) of the control gates are different, and L1 is longer than L2 in this figure. Current leakage may occur if the gate length is short, and current minimization may occur if the gate length is long, such that the performance of a flash memory cell does not match the design. Thus, the lengths of the control gates in the flash memory cell must be equal to ensure the functions and characteristics of the flash memory.

Due to the rapid advancement of the integration of memory, size of all elements must continuously decrease to achieve high integration. Conventional fabrication of flash memory relies upon masks to define sizes and positions of elements, but limitation of mask alignment causes problems for finer line width, where alignments are difficult. Even tiny misalignments may cause function fail in semiconductor elements.

SUMMARY OF THE INVENTION

In order to overcome the above problems, the invention forms sidewall spacers on the sidewalls of "Z type" and "reversed Z type" control gates. This results in easy control for the process and sizes of the control gates and avoid the influence of line width. Length at the bottom of the control gate is consequently assured, which improves the conventional fabrication of flash memory. By having the sidewall spacers, disagreement among lengths of control gates caused by misalignment when forming control gates and contact window is avoided, thus characteristics of flash memory are improved. The method provided in this invention is not only useful in fabricating highly integrated flash memory, but defects caused by misalignment in conventional process are avoided.

This invention provides a method for fabricating a flash memory cell, comprising the following steps: providing a semiconductor substrate; defining an active area on the substrate; forming a first gate insulating layer within the active area; forming a first conductive layer on the first gate insulating layer; forming a first masking layer on the first conductive layer; removing a portion of the first masking to form a first opening and expose the first conductive layer; forming a floating gate insulating layer on the exposed surface of the first conductive layer by an oxidation process; removing a portion of the first masking between the two adjacent floating gate insulating layers to expose the surface of the first conductive layer; removing a portion of the first conductive layer and the first insulating layer between the two adjacent floating gate insulating layers using the floating gate insulating layer as a hard mask, such that a second opening is formed to expose the surface of the substrate; forming a source region by implanting impurity ions through the second opening into the substrate; forming a second insulating layer on the surface of the floating gate insulating layer and the first masking layer and filling the second opening; performing a planarization process using the first masking layer as a stop layer to remove a portion of the second insulating layer on the first masking layer and leave the portion on the floating gate insulating layer and in the second opening; removing the first masking layer; forming a floating gate region using the remaining second insulating layer as a mask and etching portions of the first conductive layer and the first insulating layer to expose the surface of the substrate, such that the first conductive layer remaining under the floating gate insulating layer becomes a floating gate, the remaining first insulating layer becomes a gate insulating layer, and then, the remaining second insulating layer, the gate insulating layer and the floating gate are combined as the floating gate region; forming a third insulating layer to cover the surface of the substrate and the surface and the sidewalls of the floating gate region; forming a second conductive layer on the third insulating layer; forming a fourth insulating layer on the second conductive layer; removing portions of the fourth insulating layer, such that the fourth insulating layer remaining on the sidewalls of the second conductive layer forms first sidewall spacers; forming control gates and a tunneling oxide using the first sidewall spacers as a hard mask and removing portions of the second conductive layer and the third insulating layer to form a third opening on the remaining second insulating layer and a fourth opening on the substrate, such that the remaining second conductive layer becomes the control gates, and then the remaining third insulating layer becomes a tunneling oxide; forming second sidewall spacers on the sidewalls of the third opening and the fourth opening; and forming a drain region on the substrate within the fourth opening.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 1A:
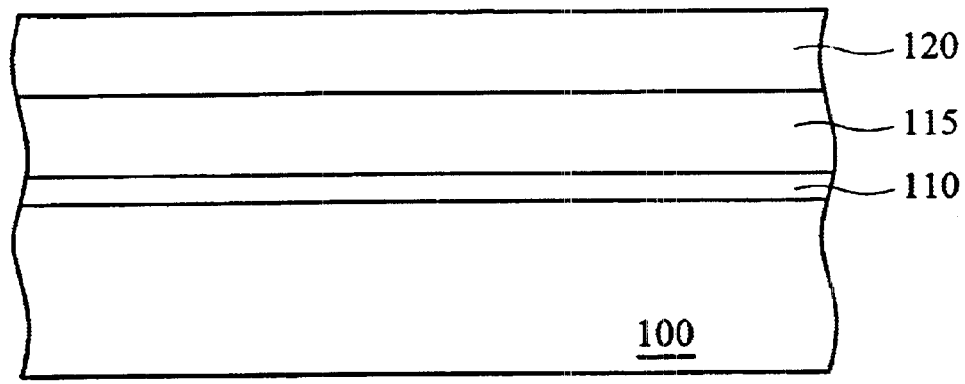
FIGS. 1A through 1G illustrate, in cross section, the process in accordance with a conventional flash memory device.
Figure 1B:
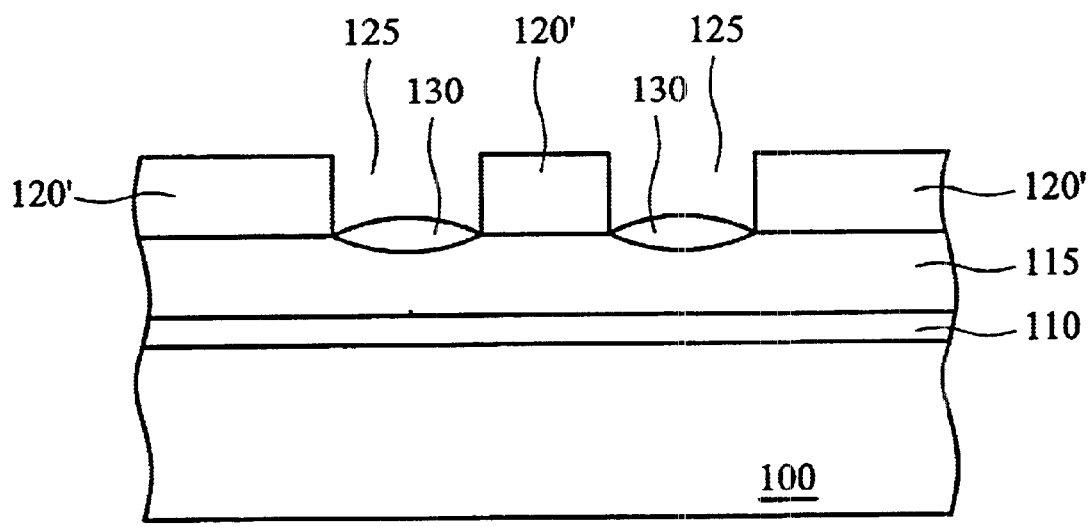
Figure 1C:
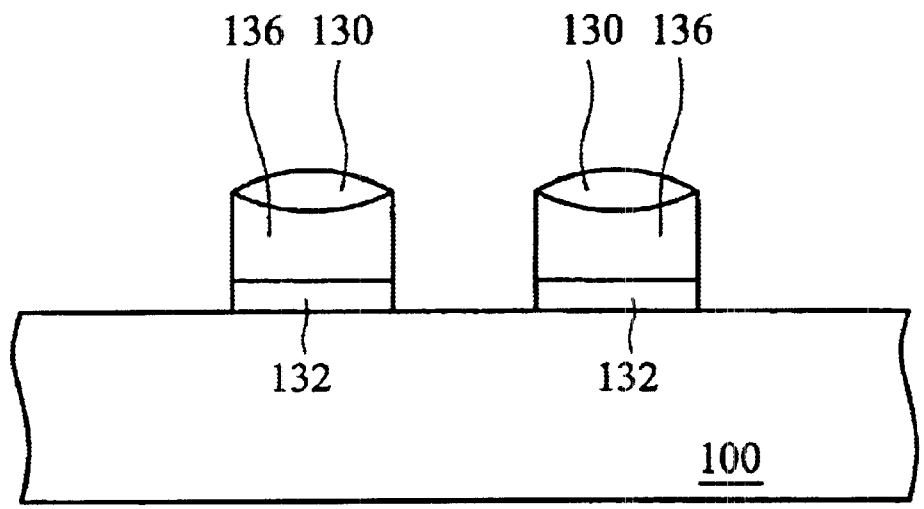
Figure 1D:
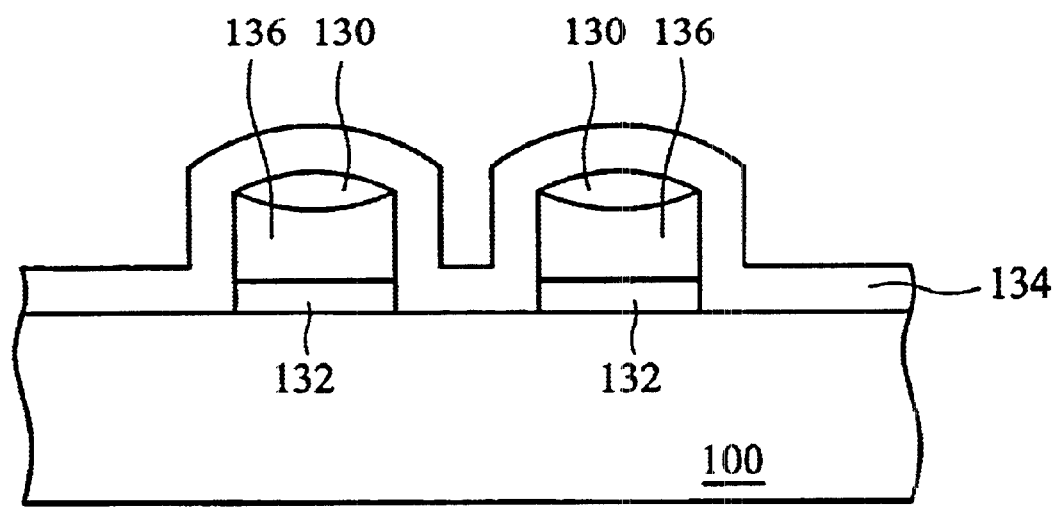
Figure 1E:
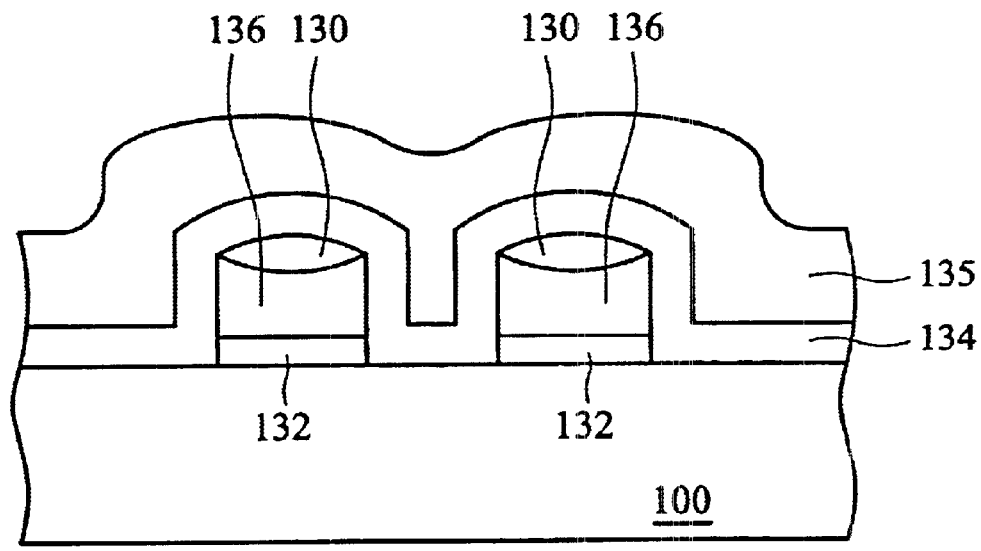
Figure 1F:
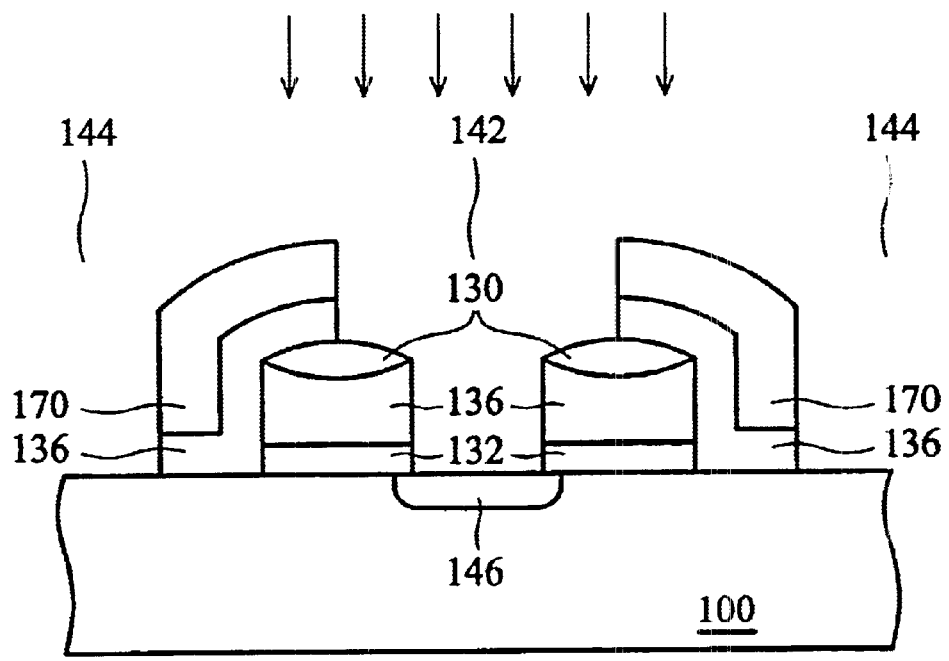
Figure 1G:
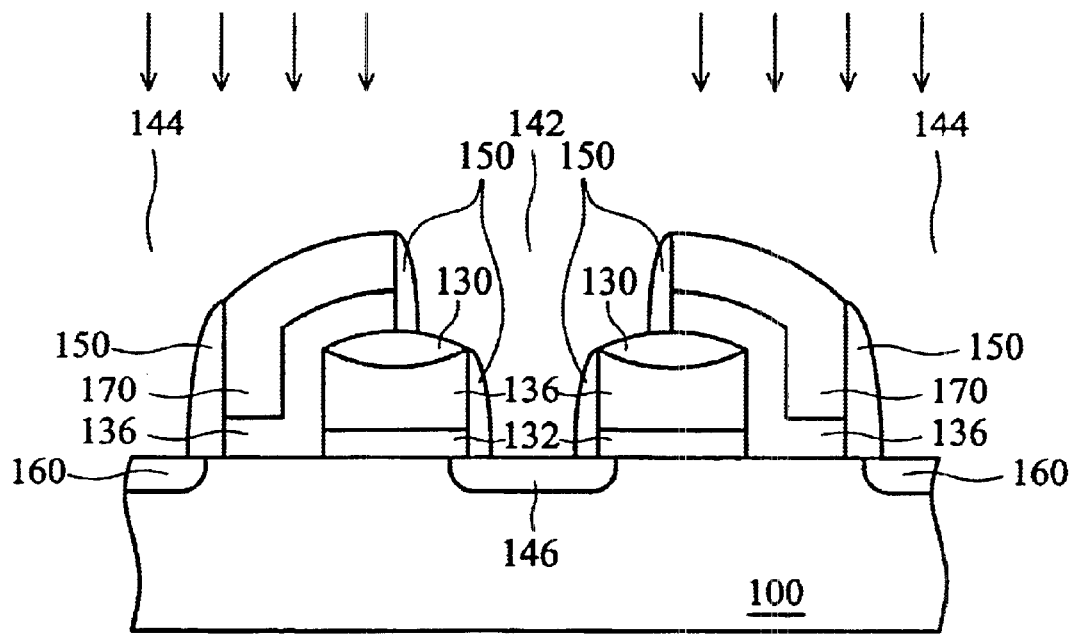
Figure 1H:
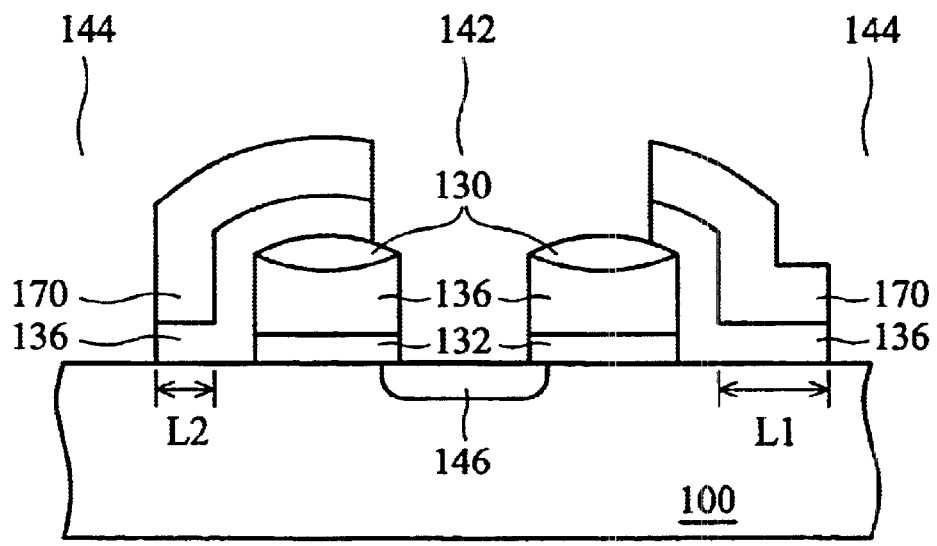
FIG. 1H illustrates, in cross section, how the lengths of the control gates are different due to misalignment when applying conventional processes.
Figure 2A:
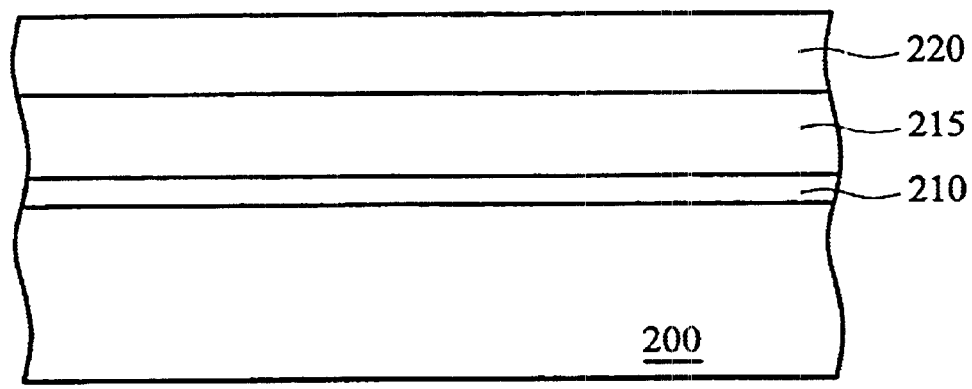
FIGS. 2A through 2J illustrate, in cross section, the process in accordance with the present invention.

As shown in FIG. 2A, a semiconductor substrate 200, for example, a p-type silicon or germanium substrate, is provided. Using LOCOS or STI technique, a field insulating layer (not shown) is formed to define the active area (not shown) on the substrate 200. A first insulating layer 210 is formed on the substrate 200 within the active area. The first insulating layer 210 can be oxide formed by oxidation and has a thickness of from 50 to 200 angstroms. Then, a first conductive layer 215, which has a thickness of about 1000 to 2000 angstroms, is formed on the first insulating layer 210. The first conductive layer 215 is usually doped polycrystalline silicon formed by CVD. The first conductive layer 215 can be doped by phosphorus ions or arsenic ions by diffusion, implantation or in-situ doping. A first masking layer 220, with a thickness of about 500 to 3000 angstroms, is formed on the first conductive layer 215. The first masking layer 220 can be SiN and is formed by low pressure chemical vapor deposition (LPCVD).

Figure 2B:
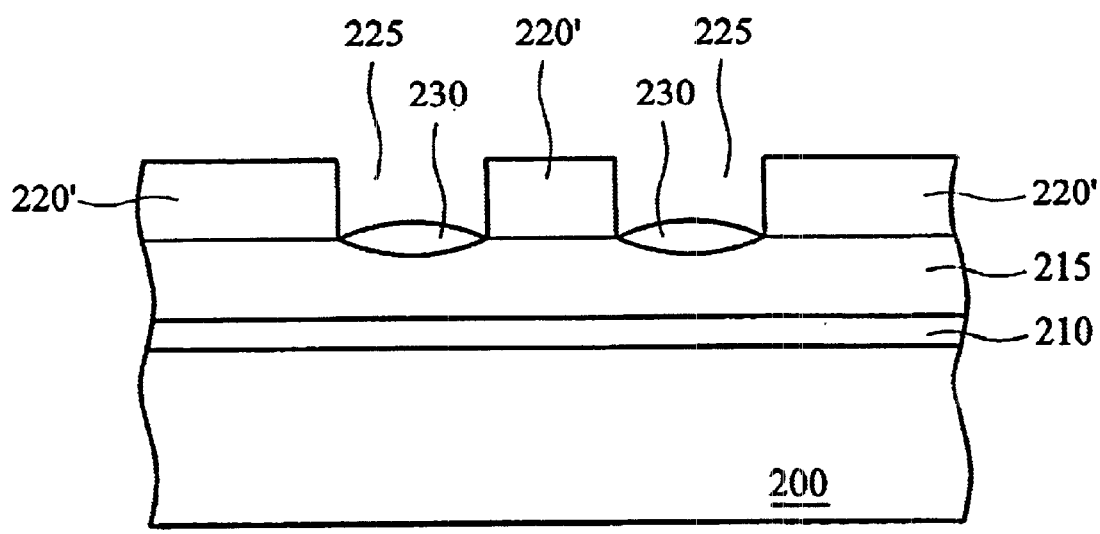

As shown in FIG. 2B, the first masking layer 220 is defined by photolithography and etching. Afterwards, a portion of the first masking 220 is removed to form a first opening 225. The remaining first masking layer 220 will be referred to as 222' hereafter. An oxidation is performed on the exposed surface of the first conductive layer 215 and a floating gate insulating layer 230 is formed.

Figure 2C:
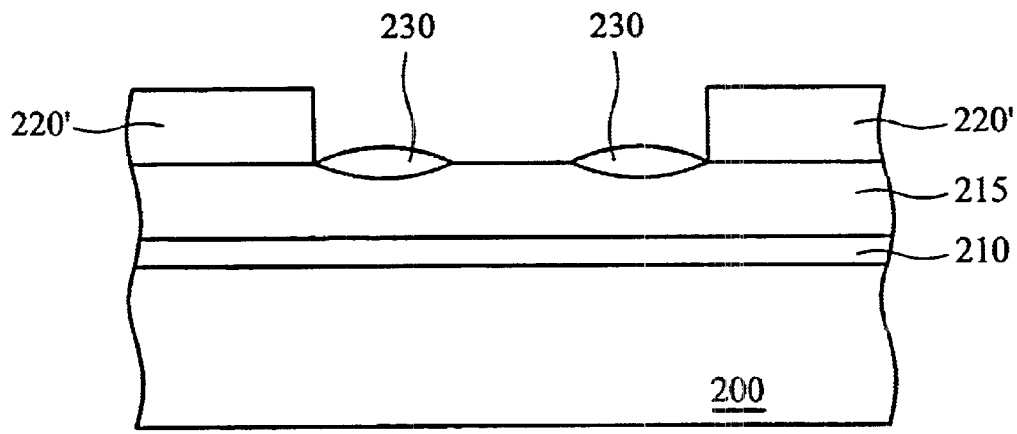

As shown in FIG. 2C, a portion of the first masking layer 220' between the two adjacent floating gate insulating layers 230 is removed to expose the surface of the first conductive layer 215.

Figure 2D:
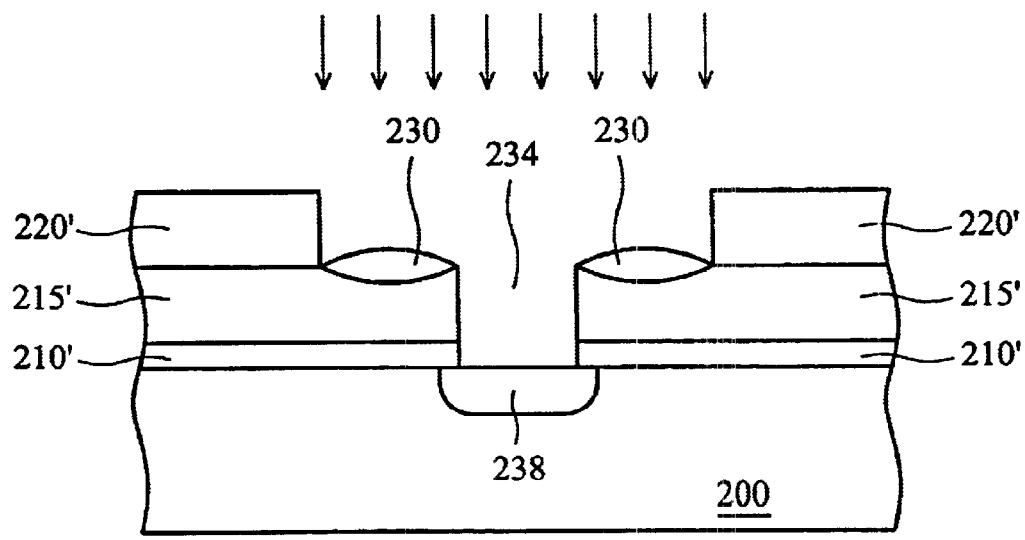

As shown in FIG. 2D, the floating gate insulating layer 230 and the first masking layer 220' are used as a mask to remove a portion of the first conductive layer 215 and the first insulating layer 210 between the two adjacent floating gate insulating layers 230, such that a second opening 234 is formed to expose the surface of the semiconductor substrate 200. The remaining first conductive layer 215 and first insulating layer 210 will be referred to as 215' and 210' hereafter. Next, a source region 238 is formed on the exposed substrate 200 by implanting N-type ions, such as phosphorus or arsenic into the substrate 200, which is exposed in the second opening 234.

Figure 2E:
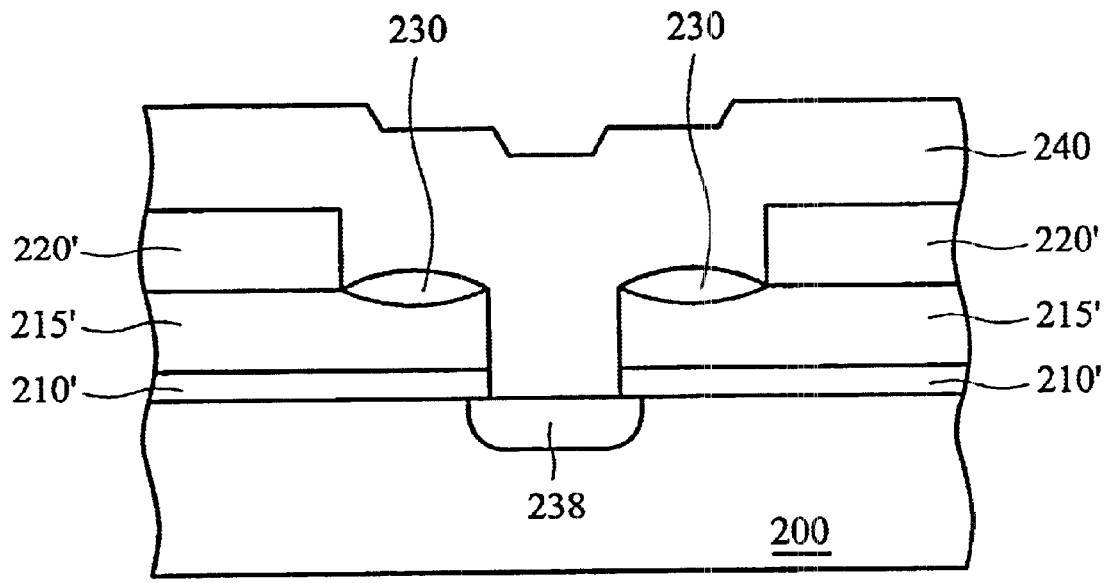

As shown in FIG. 2E, a second insulating layer 240 is formed on the surface of the floating gate insulating layer 230 and the first masking layer 220' and fills the second opening 234. The second insulating layer 240 has a thickness of about 1000 to 5000 angstroms and is usually oxide formed by LPCVD.

Figure 2F:
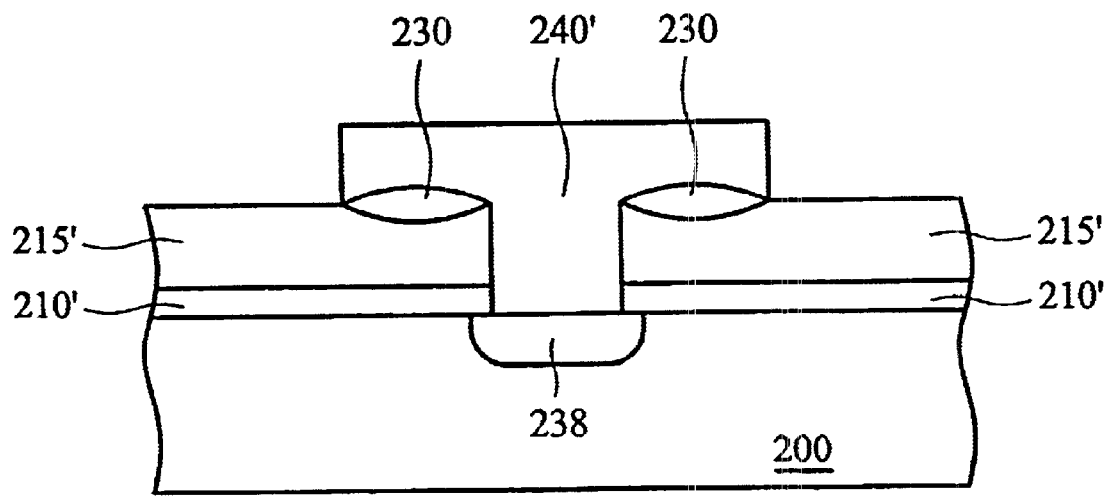

As shown in FIG. 2F, using the first masking layer 220' as a stop layer, a planarization process is performed to remove a portion of the second insulating layer 240 on the first masking layer 220' and leave the portion on the floating gate insulating layer 230 and in the second opening 234. The remaining second insulating layer 240 will be expressed as 240' hereafter. The planarization process can be a chemical mechanical planarization. Then, the first masking layer 220' is removed by etching, such as isotropic etching.

Figure 2G:
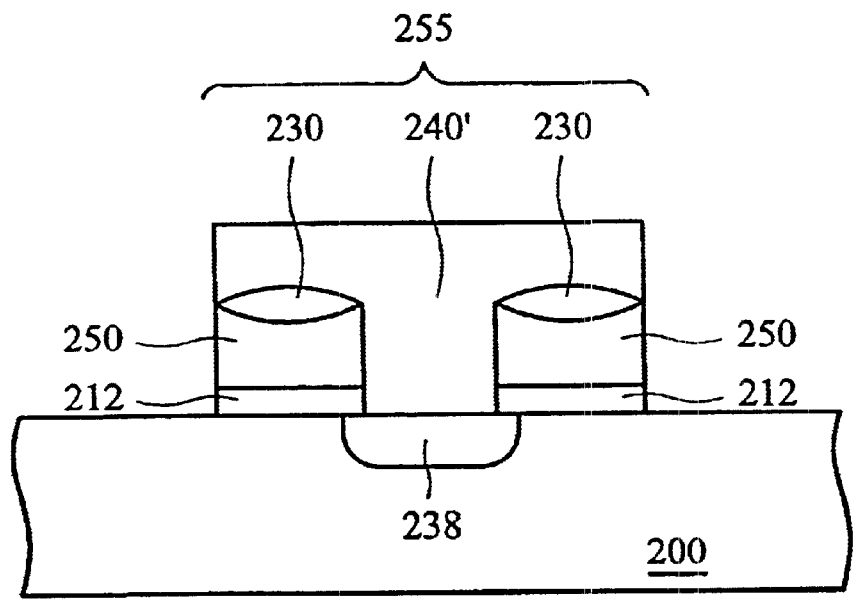

As shown in FIG. 2G, the remaining second insulating layer 240' is used as a mask to etch portions of the first conductive layer 215' and the first insulating layer 210' uncovered by the second insulating layer 240, such that the surface of the semiconductor substrate 200 is exposed. Afterwards, the first conductive layer 215' remaining under the floating gate insulating layer 230 becomes a floating gate 250, and then, the remaining first insulating layer 210' becomes a gate insulating layer 212. The remaining second insulating layer 240', the gate insulating layer 212 and the floating gate 250 are combined as a floating gate region 255.

Figure 2H:
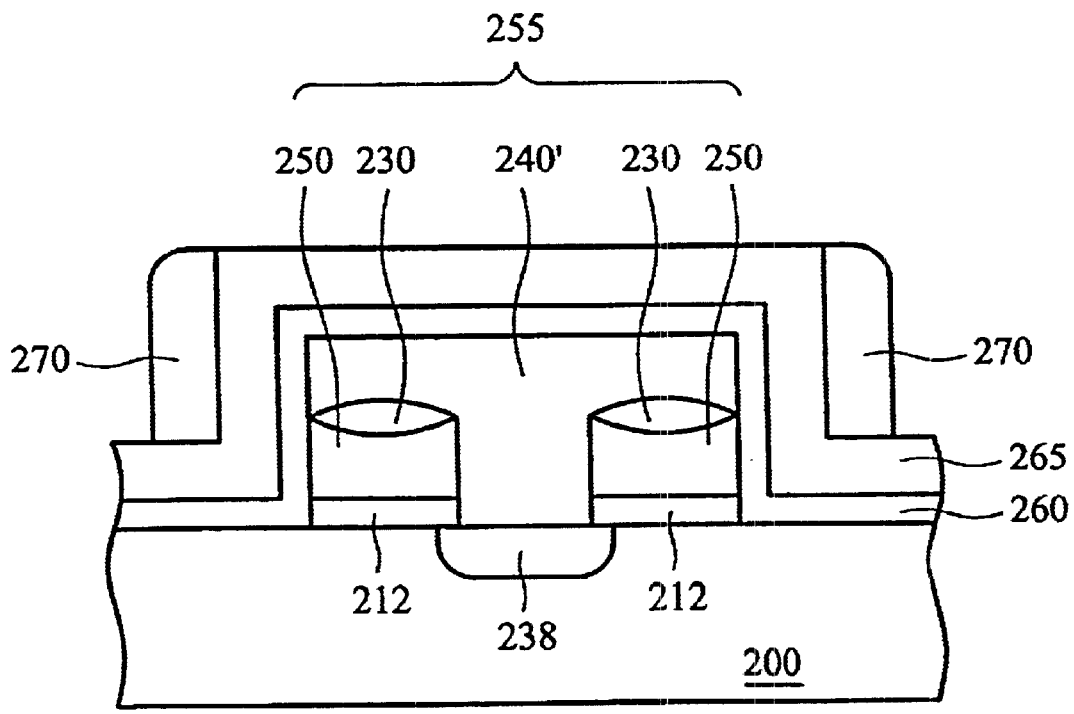

As shown in FIG. 2H, a third insulating layer 260 is formed to cover the surface of the substrate 200 and the surface and the sidewalls of the floating gate region 255. The third insulating layer 260 can be oxide and is formed by LPCVD technique and has a thickness of from 50 to 250 angstroms. Next, a second conductive layer 265 is formed on third insulating layer 260. The second conductive layer 265 has a thickness of about 1000 to 2000 angstroms and is usually made of the doped polycrystalline silicon formed by LPCVD. The second conductive layer 235 can be doped by the phosphorus ions or arsenic ions by diffusion, implantation or in-situ doping. Then, a fourth insulating layer (not shown) is formed on the second conductive layer 265. The fourth insulating layer has a thickness of about 1000 to 3000 angstroms and is usually made of the nitride formed by CVD. Etching is performed to remove portions of the fourth insulating layer and form first sidewall spacers 270 on the sidewalls of the second conductive layer 265.

Figure 2I:
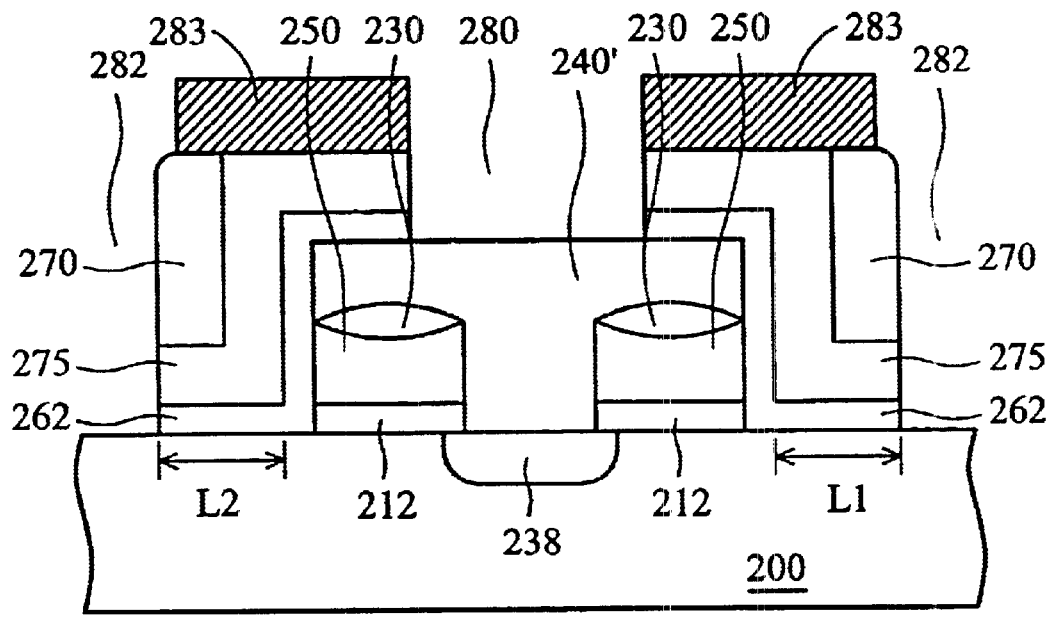

As shown in FIG. 2I, a photoresist layer 283 is defined on the second conductive layer 265. Next, using the first sidewall spacers 270 as a hard mask, portions of the second conductive layer 265 and the third insulating layer 260 are removed by photolithography and etching to form a third opening 280 on the remaining second insulating layer 240' and a fourth opening 282 on the substrate 200. Such that the remaining second conductive layer 265 becomes "Z type" and "reversed Z type" control gates 275, and then, the remaining third insulating layer 260 becomes a tunneling oxide 262. Next, the photoresist layer 283 is removed. L1 and L2 are the gate length of the right side "Z type" and left side "reversed Z type" control gate respectively. L1 and L2 can be assured equal due to the first sidewall spacers 270's use as a mask within the processes of the present invention.

Figure 2J:
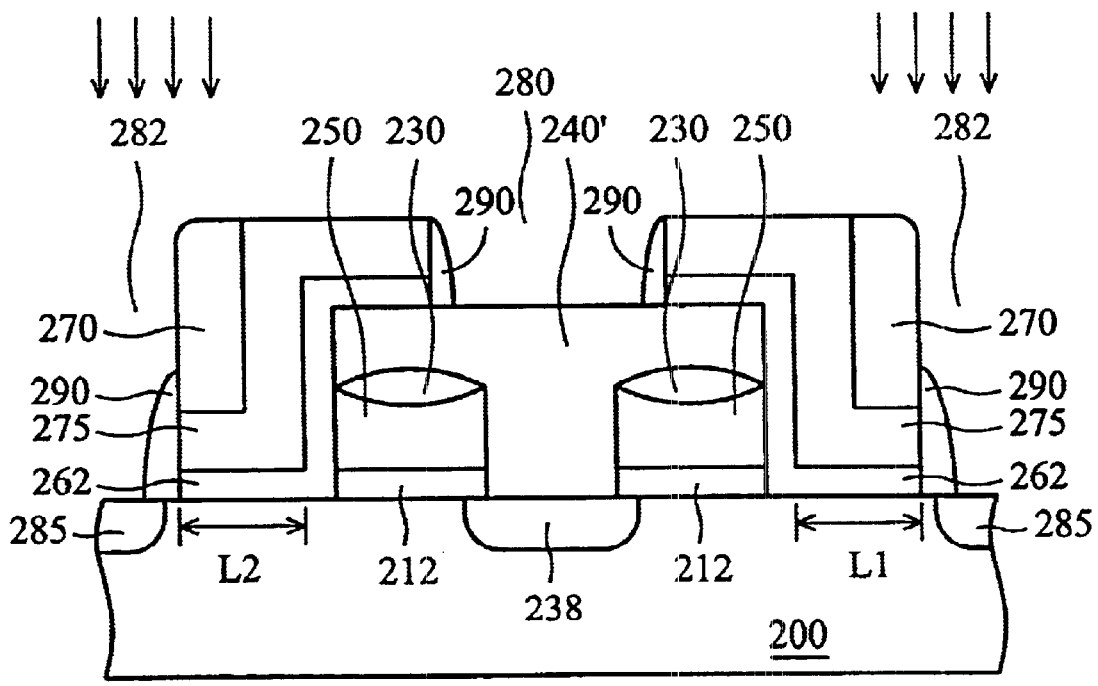

As shown in FIG. 2J, a fifth insulating layer (not shown) is formed to cover the surface of the control gates 275 and the first sidewall spacers 270, and the bottom and the sidewalls of the third opening 280 and the fourth opening 282. The fifth insulating layer has a thickness of about 200 to 2000 angstroms and is usually made of the nitride formed by CVD. Etching is performed to remove portions of the fifth insulating layer and form second sidewall spacers 290 on the sidewalls of the tunneling oxide 262 and the control gates 275 (the sidewalls of the third opening 280 and the fourth opening 282). A drain region 285 is formed on the exposed substrate 200 by implanting N-type ions, such as phosphorus or arsenic into the substrate 200, which is exposed in the fourth opening 282. The manufacture of a cell of flash memory is thus completed.

Figure 2K:
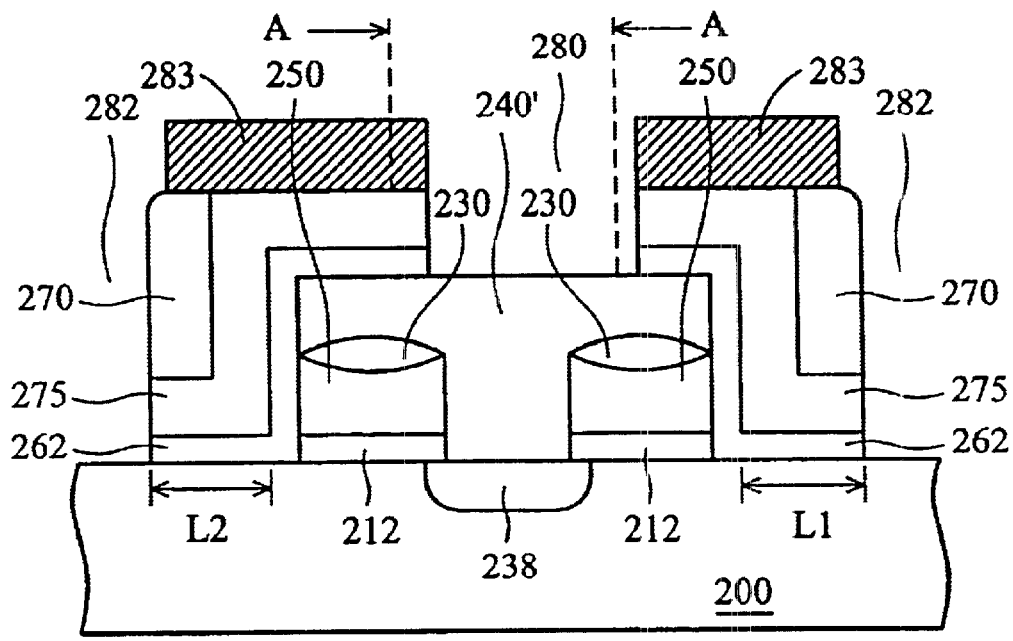
FIG. 2K illustrates, in cross section, formation of control gates if photolithography is misaligned, the gate length of the control gates not affected using the present invention.

As shown in FIG. 2K, the third opening 280 defined by the photoresist layer 283 may shift when photolithography is misaligned. A dotted line A shows the correct position if the third opening 280 does not shift. Regardless of the top portion of the "Z type" and "reversed Z type" control gates 275 not being equal due to photolithography error, the lengths of the bottom portion (gate length; L1 and L2) of the "Z type" and "reversed Z type" control gates must be equal due to the first sidewall spacers 270' s use as a mask within anisotropic process to form the control gates 275. Thus, functions and characteristics of the flash memory can be assured.

Figure 2L:
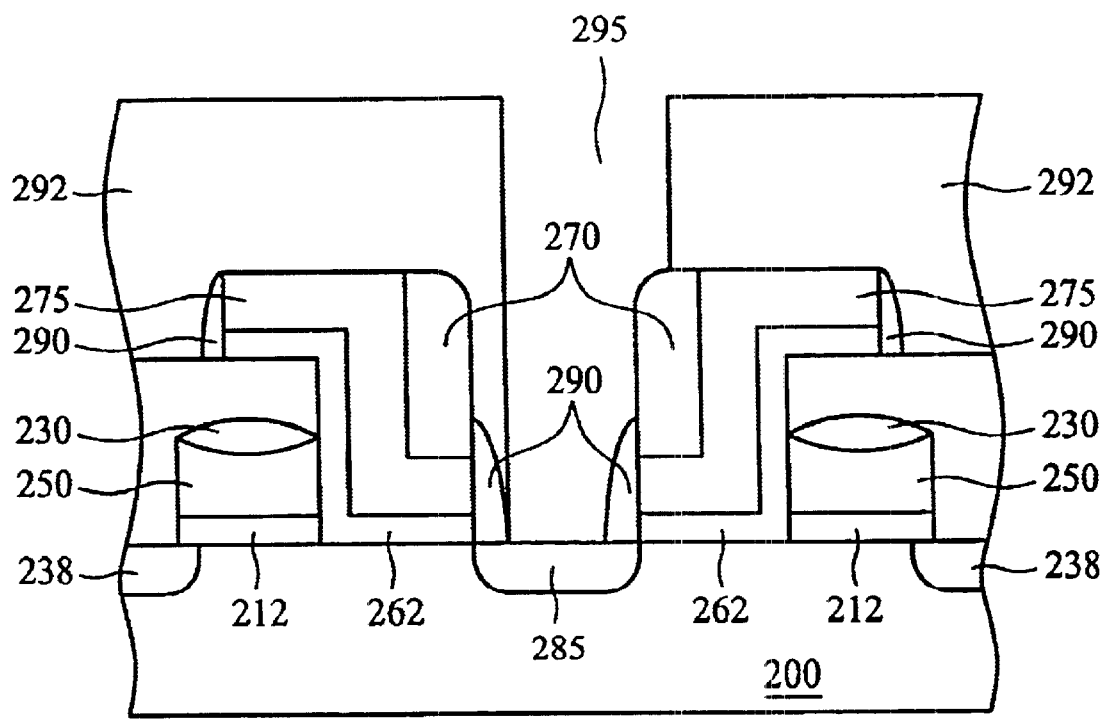
FIG. 2L illustrate, in cross section, formation of contact window if photolithography is misaligned, the gate length of the control gates not affected using the present invention.

As shown in FIG. 2L, a set of the control gates 275 and the floating gate 250 in FIG. 2J and another adjacent set of the control gates 275 and the floating gate 250 are drawn. A sixth insulating layer 292 is formed on the control gates 275 and the floating gate 250 after the cell of flash memory is completed. A portion of the sixth insulating layer 292 is removed to define a contact window 295. When photolithography is misaligned, the, gate length of the control gates 275 will not be affected due to the control gates 275 being protected by the first sidewall spacers 270. Thus, functions and characteristics of the flash memory can be assured. In addition, using the first sidewall spacers 270, a self-aligned process can be performed to form the contact window 295. Thus, feature size of flash memory is minimized and memory devices become more integrated.

It is to be understood that the present invention is not limited to the embodiments described above, but encompasses any and all embodiments within the scope of the following claims.

What is claimed is:

1. A method of fabricating a flash memory cell, comprising the steps of:

providing a semiconductor substrate;

defining an active area on the substrate;

forming a first gate insulating layer within the active area;

forming a first conductive layer on the first gate insulating layer;

forming a first masking layer on the first conductive layer;

removing a portion of the first masking to form a first opening and expose the first conductive layer;

forming a floating gate insulating layer on the exposed surface of the first conductive layer by an oxidation process;

removing a portion of the first masking between the two adjacent floating gate insulating layers to expose the surface of the first conductive layer;

removing a portion of the first conductive layer and the first insulating layer between the two adjacent floating gate insulating layers using the floating gate insulating layer as a hard mask, such that a second opening is formed to expose the surface of the substrate;

forming a source region by implanting impurity ions through the second opening into the substrate;

forming a second insulating layer on the surface of the floating gate insulating layer and the first masking layer and filling the second opening;

performing a planarization process using the first masking layer as a stop layer to remove a portion of the second insulating layer on the first masking layer and leaving the portion on the floating gate insulating layer and in the second opening;

removing the first masking layer;

forming a floatinq gate region using the remaining second insulating layer as a mask and etching portions of the first conductive layer and the first insulating layer to expose the surface of the substrate, such that the first conductive layer remaining under the floating gate insulating layer becomes a floating gate, the remaining first insulating layer becomes a gate insulating layer, and then, the remaining second insulating layer, the gate insulating layer and the floating gate are combined as the floating gate region;

forming a third insulating layer to cover the surface of the substrate and the surface and the sidewalls of the floating gate region;

forming a second conductive layer on the third insulating layer;

forming a fourth insulating layer on the second conductive layer;

removing portions of the fourth insulating layer, such that the fourth insulating layer remaining on the sidewalls of the second conductive layer forms first sidewall spacers;

forming control gates and a tunneling oxide using the first sidewall spacers as a hard mask and removing portions of the second conductive layer and the third insulating layer to form a third opening on the remaining second insulating layer and a fourth opening on the substrate, such that the remaining second conductive layer becomes the control gates, and then, the remaining third insulating layer becomes a tunneling oxide;

forming second sidewall spacers on the sidewalls of the third opening and the fourth opening; and forming a drain region on the substrate within the fourth opening.

2. The method as recited in claim 1, wherein the semiconductor substrate is a silicon substrate.

3. The method as recited in claim 1, wherein the first conductive layer is doped polycrystalline silicon.

4. The method as recited in claim 1, wherein the first conductive layer has a thickness of 1000 to 2000 angstroms.

5. The method as recited in claim 1, wherein the first masking layer is SiN.

6. The method as recited in claim 1, wherein the first masking layer has a thickness of 500 to 3000 angstroms.

7. The method as recited in claim 1, wherein the second insulating layer is oxide.

8. The method as recited in claim 1, wherein the second insulating layer has a thickness of 1000 to 5000 angstroms.

9. The method as recited in claim 1, wherein the third insulating layer is oxide.

10. The method as recited in claim 1, wherein the third insulating layer has a thickness of 50 to 250 angstroms.

11. The method as recited in claim 1, wherein the second conductive layer is doped polycrystalline silicon.

12. The method as recited in claim 1, wherein the second conductive layer has a thickness of 1000 to 2000 angstroms.

13. The method as recited in claim 1, wherein the fourth insulating layer is nitride.

14. The method as recited in claim 1, wherein the fourth insulating layer has a thickness of 1000 to 3000 angstroms.

15. The method as recited in claim 1, wherein the formation of the second insulating sidewall spacers further comprises the steps of:

forming an insulation layer to cover the surface of the control gates and the first sidewall spacers, and the bottom and the sidewalls of the third opening and the fourth opening; and removing portions of the insulating layer, such that the remaining insulating layer forms second sidewall spacers on the sidewalls of the third opening and the fourth opening.

16. The method as recited in claim 15, wherein the insulating layer is nitride.

17. The method as recited in claim 15, wherein the insulating layer has a thickness of 200 to 2000 angstroms.

* * * * *